(12) United States Patent
Moon et al.

(10) Patent No.: US 6,458,518 B1
(45) Date of Patent: Oct. 1, 2002

(54) PHOTORESIST STRIPPER COMPOSITION AND METHOD FOR STRIPPING PHOTORESIST USING THE SAME

(75) Inventors: Sang-sik Moon; Mi-sook Jeon; Pil-kwon Jun; June-ing Kil; Je-eung Park; Sang-mun Chun, all of Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/045,062

(22) Filed: Jan. 15, 2002

Related U.S. Application Data

(62) Division of application No. 09/679,558, filed on Oct. 6, 2000.

(30) Foreign Application Priority Data

Oct. 8, 1999 (KR) ............................................. 99-43486

(51) Int. Cl.[7] ................................................. G03F 7/42
(52) U.S. Cl. ...................... 430/329; 430/331; 510/176
(58) Field of Search ................................ 430/329, 331; 510/176

(56) References Cited

U.S. PATENT DOCUMENTS

| | | | |
|---|---|---|---|
| 3,923,882 A | 12/1975 | Kiff | 260/533 R |
| 4,229,514 A | 10/1980 | Kurita et al. | 430/195 |
| 5,268,260 A | 12/1993 | Bantu et al. | 430/325 |
| 5,296,330 A | 3/1994 | Schulz et al. | 430/191 |
| 5,362,608 A | 11/1994 | Flaim et al. | 430/195 |
| 5,413,729 A | 5/1995 | Gaul | |
| 5,612,303 A | 3/1997 | Takayanagi et al. | 510/176 |
| 5,637,442 A | 6/1997 | Bhatt et al. | 430/311 |
| 5,677,101 A | 10/1997 | Noguchi et al. | 430/166 |
| 5,866,305 A | 2/1999 | Chon et al. | 430/331 |
| 6,117,623 A * | 9/2000 | Koshiyama et al. | 430/331 |
| 6,159,646 A | 12/2000 | Jeon et al. | 430/331 |

FOREIGN PATENT DOCUMENTS

GB    2331594 a    5/1999

* cited by examiner

*Primary Examiner*—Richard Schilling
(74) *Attorney, Agent, or Firm*—Volentine Francos, PLLC

(57) ABSTRACT

A photoresist stripper composition is formed of a mixture of acetone, γ-butyrolactone, and ester solvent. A photoresist stripping method includes spraying the photoresist stripper composition over a substrate while rotating the substrate at a relatively low speed, so as to strip photoresist from the substrate. The rotation of the substrate is stopped for a short period of time, and thereafter the photoresist stripper composition is again sprayed over the substrate while rotating the substrate at a relatively high speed. Then, the substrate is rinsed with pure water.

12 Claims, 2 Drawing Sheets

PHOTORESIST STRIPPER COMPOSITION AND METHOD FOR STRIPPING PHOTORESIST USING THE SAME

CROSS REFERENCE OF RELATED APPLICATIONS

This is a divisional of application Ser. No. 09/679,558, filed Oct. 6, 2000, which is incorporated herein by reference in its entirety.

BACKGROUND OF THE INVENTION

1. Field of the Invention

The present invention relates to a photoresist stripper composition for use in removing photoresist from a substrate such as a silicon wafer, and to a method for stripping photoresist using the photoresist stripper composition.

2. Description of the Related Art

In the manufacture of semiconductor devices such as integrated circuits (ICs), large scale integrated circuits (LSIs), and liquid crystal displays (LCDs), photoresists are extensively used as a coating mask material. In a common method for fabricating ICs by photolithography with a photoresist, the photoresist is evenly deposited on a conductive metal layer or a dielectric layer formed on a substrate, so that a photoresist layer is formed thereon. Then, the solvent contained in the photoresist layer is vaporized by a soft baking process so as to stabilize the photoresist layer. After the soft baking process, the photoresist layer is exposed to UV radiation, electron-beams, X-rays and so forth, and then subjected to a developing process to form a photoresist pattern on the substrate. Following this, the underlying conductive metal layer or the dielectric layer is selectively etched using the photoresist pattern as a mask, thereby forming fine circuit patterns. Thereafter, the photoresist is removed using a stripper.

In the photolithography process, it is also important to remove photoresist present on the edge or backside of the wafer after the soft baking process. Otherwise, defects can occur during a subsequent etching or ion implantation process, thereby lowering yield. A stripper containing an organic solvent is commonly used for this purpose.

Likewise, wafers undergoing reworking, which have been previously identified as defective or which have been set aside for testing, must also have photoresist removed by application of a stripper.

When the photoresist pattern from the developing process is subjected to post exposure baking (PEB) at a high temperature, ion implantation and DUV radiation, the photoresist pattern is hardened, and made more resistant to an organic solvent by cross-linking.

In removing the cured photoresist material, a solvent containing halogenated hydrocarbons and phenolic hydrocarbons has been used in the prior art. However, use of such solvents is disfavored because it causes hazardous working conditions and environmental concerns over the handling of waste matter.

Also, acidic or alkali strippers can be used to remove the cured photoresist material. However, the acidic or alkali strippers can corrode an underlying metal on the substrate, which may be an aluminum (Al) layer, or a metal alloy layer containing copper (Cu) or tungsten (W). This may limit the capacity for forming microminiature interconnection patterns.

When a common organic solvent is used as a photoresist stripper, an organic solvent such as isopropyl alcohol must be used as a rinsing solution. Thus, the rinsing process becomes complicated and the safety concerns arise.

Some conventional chemicals or solvents for use as a photoresist stripper have a very slow dissolution rate over the cured photoresist, or cause incomplete dissolution over the same. Such photoresist residues from the stripping process are not removed completely during subsequent processes, thereby adversely effecting the reliability of a device in terms of its electrical properties.

Therefore, there is a need for a photoresist stripper which is capable of completely and quickly removing the cured photoresist from the substrate without causing damage or contamination to the substrate.

Also, as the integration density of semiconductor devices increases, the fabrication of semiconductor devices becomes complicated by the need for fine line pattern formation. 1-Gigabit or more semiconductor devices, in which a pattern size has a design rule of 0.2 $\mu$m or less, cannot be achieved by a conventional resist which is sensitive to light from a KrF eximer laser (248 nm). For this reason, a novel photolithography technique using an ArF eximer laser (1 93 nm) as an exposure light source has been introduced.

Therefore, there is a need for a photoresist stripper composition capable of being used, regardless of the polarity of photoresist, for a variety of photoresists including conventional photoresists, such as i-line resist and G-line resist, which contain Cresol Novolak Resin as a major component, and chemically amplified resists sensitive to an eximer laser or a DUV exposure light source, with the photoresist stripper composition also having a high solubility with respect these photoresists.

SUMMARY OF THE INVENTION

It is a first objective of the present invention to provide a photoresist stripper composition which is capable of effectively and quickly stripping photoresist coated on a substrate regardless of the kind and the polarity of the photoresist.

It is a second objective of the present invention to provide a photoresist stripper composition which is capable of efficiently and safely stripping photoresist coated on a substrate, either cured or uncured, without causing damage or contamination to an underlying layer.

It is a third objective of the present invention to provide a photoresist stripper composition which is capable of effectively and efficiently stripping photoresist from a wafer during a rinsing step on the edge or backside of the wafer, or during a reworking process on wafers which have defects or which were previously used for testing.

It is a fourth objective of the present invention to provide a method for stripping photoresist, by which photoresist can be effectively removed from a substrate without the need of performing an additional rinsing process with an organic solvent after stripping.

To achieve the above objectives of the present invention, there is provided a photoresist stripper composition comprising a mixture of acetone, $\gamma$-butyrolactone, and an ester solvent.

Preferably, the ester solvent comprises acetic acid ester. Preferably, the ester solvent comprises at least one selected from the group consisting of n-butyl acetate, amyl acetate, ethyl acetoacetate, isopropyl acetate and propylene glycol monomethyl ether acetate.

Preferably, the mixture of the photoresist stripper composition comprises: 3 to 35% by weight acetone; 2 to 13% by weight $\gamma$-butyrolactone; and 55 to 95% by weight ester solvent, based on the total weight of the mixture.

More preferably, the mixture of photoresist stripper composition comprises: 8 to 15% by weight acetone; 4 to 7% by weight y-butyrolactone; and 80 to 90% by weight ester solvent, based on the total weight of the mixture.

Preferably, the photoresist stripper composition further comprises a surfactant.

According to another aspect of the present invention, there is provided a photoresist stripping method comprising spraying a photoresist stripper composition comprising a mixture of acetone, y-butyrolactone and an ester solvent, over a substrate while rotating the substrate at a relatively low speed, so as to strip photoresist from the substrate. The rotation of the substrate is stopped for a short period of time, and thereafter the photoresist stripper composition is sprayed over the substrate while rotating the substrate at a relatively high speed. Then, the substrate is rinsed with pure water.

Preferably, after stopping the rotation of the substrate for a short period of time, the photoresist stripping method further comprises spin drying the substrate.

Preferably, after spraying the photoresist stripper composition over the substrate while rotating the substrate at a relatively high speed, the photoresist stripping method further comprises spin drying the substrate.

The photoresist stripper composition according to the present invention is effective in removing a variety of photoresists at room temperature. Also, the photoresist stripper composition has a rapid dissolution rate and is very volatile, and thus it does not remain on the surface of the wafer after stripping. In addition, the method for stripping photoresist with the photoresist stripper composition can completely remove photoresist from the wafer surface, and is itself removed by simple rinsing step with water, thereby simplifying the overall process.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

Figure 1:
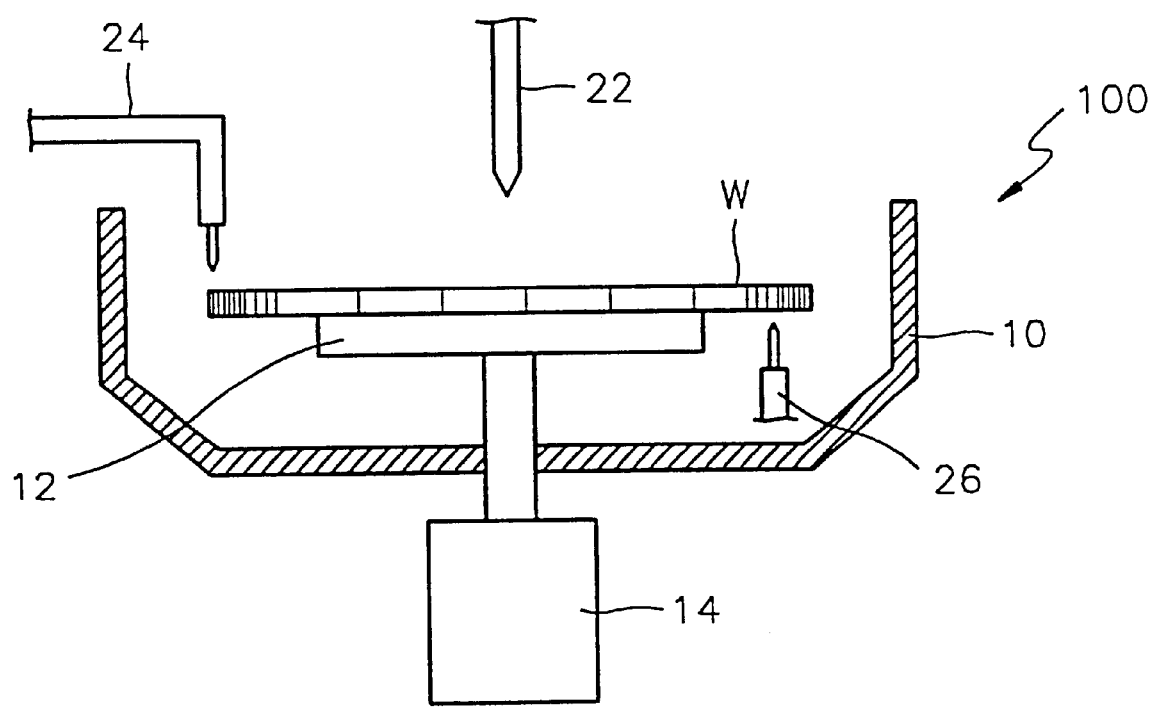
FIG. 1 is a sectional view showing the major parts of a common nozzle spray type stripper unit.

The present invention provides an organic solvent based photoresist stripper composition. The photoresist stripper composition according to the present invention, which is a mixture of acetone, y-butyrolactone and an ester solvent, is effectively applicable with respect to various kinds of photoresists at room temperature (in the range of 20 to 40° C.).

Each component of the photoresist stripper composition according to the present invention can act as a stripper.

γ-butyrolactone, which is known as a synthetic resin solvent, has a high ignition point and is relatively stable as a solvent. The safety of γ-butyrolactone is evidenced by results obtained from a skin test and a 3-month intake that indicate no toxic effect on the human body. Some physical properties of γ-butyrolactone include: specific gravity of 1.128, boiling point of 204° C., ignition point of 98° C. at near vacuum pressure and 457° C. at atmospheric pressure, and viscosity of 1.70 cP at 25° C.

Acetone is soluble in ether and is widely known as a solvent for resin, rubber, plastic, pigment and the like, and as a dissolution agent for acetylene. Some physical properties of acetone include: specific gravity of 0.792, boiling point of 56.5° C., ignition point of −15° C. at near vacuum pressure and 465° C. at atmospheric pressure, and viscosity of 0.337 cP at 25° C.

The photoresist stripper composition according to the present invention uses acetic acid esters as an organic solvent.

The ester solvents, which can be used for the photoresist stripper composition according to the present invention, include n-butyl acetate, amyl acetate, ethyl acetoacetate, isopropyl acetate and propylene glycol monomethyl ether acetate.

Preferably, the photoresist stripper composition according to the present invention comprises: 3 to 35% by weight acetone, with the preferred range being 8 to 15% by weight; 2 to 13% by weight γ-butyrolactone, with the preferred range being 4 to 7% by weight; and 55 to 95% by weight ester solvent, with the preferred range being 80 to 90% by weight, based on the total weight of the composition.

The photoresist stripper composition according to the present invention may further comprise an auxiliary component, for example, a surfactant, as needed.

The inventors found that the synergistic effects of each component of the stripper composition allow for extensive use of the photoresist stripper composition over any kind of photoresist, and that a variety of different photoresists can be removed quickly due to rapid dissolution rates of the composition.

In other words, the photoresist stripper composition according to the present invention can effectively strip photoresists formed of a variety of organic polymers, from the substrate. Photoresists formed of organic polymers are basically categorized into two types: negative-working photoresists and positive-working photoresists. Depending on the radiation source, these negative and positive working photoresists are classified into G-line resists, i-line resists, deep ultraviolet (DUV) resists, electron beam resists, X-rays resists, and ion beam resists. The photoresist stripper composition according to the present invention can effectively strip any of these photoresists.

In the field of lithography, the composition of the layer underlying the photoresist layer formed of organic polymers must be considered when selecting an appropriate stripper composition. The photoresist stripper composition according to the present invention is applicable even when the underlying layer is formed of a metal layer of, for example, aluminum, an aluminum alloy, copper or a copper alloy, in addition to when the underlying layer is formed of a common material layer such as a silicon layer, a silicon oxide layer, a silicon nitride layer and a polysilicon layer. The photoresist stripper composition according to the present invention can effectively strip the photoresist without causing damage or contamination to such underlying layers.

The dissolution abilities of components which can be used for the photoresist stripper composition according to the present invention were separately measured with respect to various photoresists. The results are given in Table 1.

TABLE 1

| | Dissolution rate, Å/sec | | | |
|---|---|---|---|---|
| | i-line resist | DUV resist | | |
| Component | SS880A7 | UV III | SEPR-402 | SEPR-430S |
| γ-butyrolactone | 15163 | 9180 | 8463 | 5600 |
| Acetone | 15163 | 9180 | 5633 | 6743 |
| n-butyl acetate | 2146 | 529 | 204 | 1388 |

In particular, the dissolution ability was tested for the effective components, y-butyrolactone and acetone, of the photoresist stripper composition according to the present invention. The resists used for the test were one i-line resist obtained as SS880A7 (Smimoto Co., Japan), and three DUV resists obtained as UV III (Shipley Company Inc., Japan), SEPR-402 (ShinEtsu Co. Japan) and SEPR-430S (ShinEtsu Co., Japan). In addition, n-butyl acetate, which is a typical organic solvent available for the photoresist composition according to the present invention, was subjected to the same test.

For the dissolution ability test, each resist was coated at a sufficient thickness on a silicon wafer (at a wafer rotation speed of 2000 rpm for 30 seconds) to prepare samples. The obtained samples were soft baked at 160° C. for 3 minutes, and y-butyrolactone, acetone and n-butyl acetate were applied to each of the samples. The dissolution rates for the components were measured using a dissolution rate meter (DRM) at 25° C. The temperature of 25° C. was maintained throughout the measurement process.

The results of Table 1 show that each of the tested components has a dissolution ability with respect to all resists used for the test. All components tested for the photoresist stripper composition according to the present invention show relatively higher dissolution rates with respect to the i-line resist, than the DUV resists.

It should be noted from Table 1 that each component having dissolution ability with respect to various photoresists will contribute to a synergistic effect in removing photoresist from a wafer when incorporated into the photoresist stripper composition according to the present invention. The synergistic effect of each component in the photoresist stripper composition is evidenced from Table 2.

Table 2 shows the dissolution ability of a particular photoresist stripper composition according to the present invention with respect to various photoresists. The particular photoresist stripper composition tested was a mixture of 5% by weight γ-butyrolactone, 10% by weight acetone and 85% by weight n-butyl acetate, based on the total weight of the mixture.

TABLE 2

| Resist | | Initial Thickness of Resist, Å | Dissolution Rate, Å/sec | Thickness of Resist after 1 second of Dissolution, Å |
|---|---|---|---|---|
| DUV resist | SEPR-402 | 7000 | >6800 | 0 |
| | SEPR-430 | 8300 | >8300 | 0 |
| | UV III | 5500 | >5500 | 0 |
| i-line resist | ip-2680 | 16000 | >16000 | 0 |
| | ip-3300 | 12000 | >12000 | 0 |
| | i-7010 | 32000 | >32000 | 0 |
| | i-900 | 5000 | >5000 | 0 |

The resists used for the dissolution ability test of the photoresist stripper composition were DUV resists obtained as SEPR402 (ShinEtsu Co. Japan), SEPR-430 (ShinEtsu Co., Japan) and UV III (Shipley Company Inc., Japan), and i-line resists obtained as ip-2680 (Tokyo Ohka Kogyo Co., Japan), ip-3300 (Tokyo Ohka Kogyo Co., Japan), i-7010 (Mitsubishi Denki Co., Japan) and i-900 (Dong-gin Chemicals Co., Korea).

For the dissolution ability test for the photoresist stripper composition, each resist was coated on a silicon wafer to be sufficiently thick (at a wafer rotation speed of 2000 rpm for 30 seconds) to prepare samples. The obtained samples were soft baked at 160° C. for 3 minutes, and the photoresist stripper composition was spread over each of the wafers using a nozzle spraying technique at 25° C. Then, the dissolution rates of the photoresist stripper composition with respect to the various resists were measured using a dissolution rate meter (DRM). The temperature of 25° C. was maintained throughout the measurement process.

Table 2 shows that all of the tested resists are completely dissolved within 1 second with the photoresist stripper composition. This result indicates that the mixture of stripper components has synergetic effects in removing photoresists from a wafer.

The photoresist stripper composition according to the present invention can be used to remove photoresists adhering to or coated on the surface of waters which were collected from a photolithography process due to failure, or which were arbitrarily extracted for process management testing, which allows for recycling of the wafers.

The photoresist stripper composition according to the present invention can also be effectively used to remove photoresist from the edge or backside of a wafer after a soft baking process.

In addition, the photoresist stripper composition according to the present invention is also effective in stripping a cured photoresist pattern, which remains after being used as an etching mask to pattern the underlying layer by photolithography.

Hereinafter, a method for stripping photoresist using the photoresist stripper composition according to the present invention will be described with reference to the appended drawings.

FIG. 1 is a sectional view showing the major parts of a common nozzle spray type stripper unit, which is available to perform the photoresist stripping method according to the present invention.

Referring to FIG. 1, a stripper unit 100 has a drain cup 10. A spin chuck 12 for supporting a wafer W placed thereon is installed in the drain cup 10. The spin chuck 12 is rotatable by action of a motor 14. A nozzle 22 is placed approximately over the center of the spin chuck 12, to apply the photoresist stripper composition 25 through the nozzle 22 over the wafer W seated on the spin chuck 12.

Also, the stripper unit 100 includes an edge rinsing nozzle 24 for spraying an edge rinsing solution over the wafer W, and a backside rinsing nozzle 26 for spraying a backside rinsing solution over the wafer W.

Figure 2:
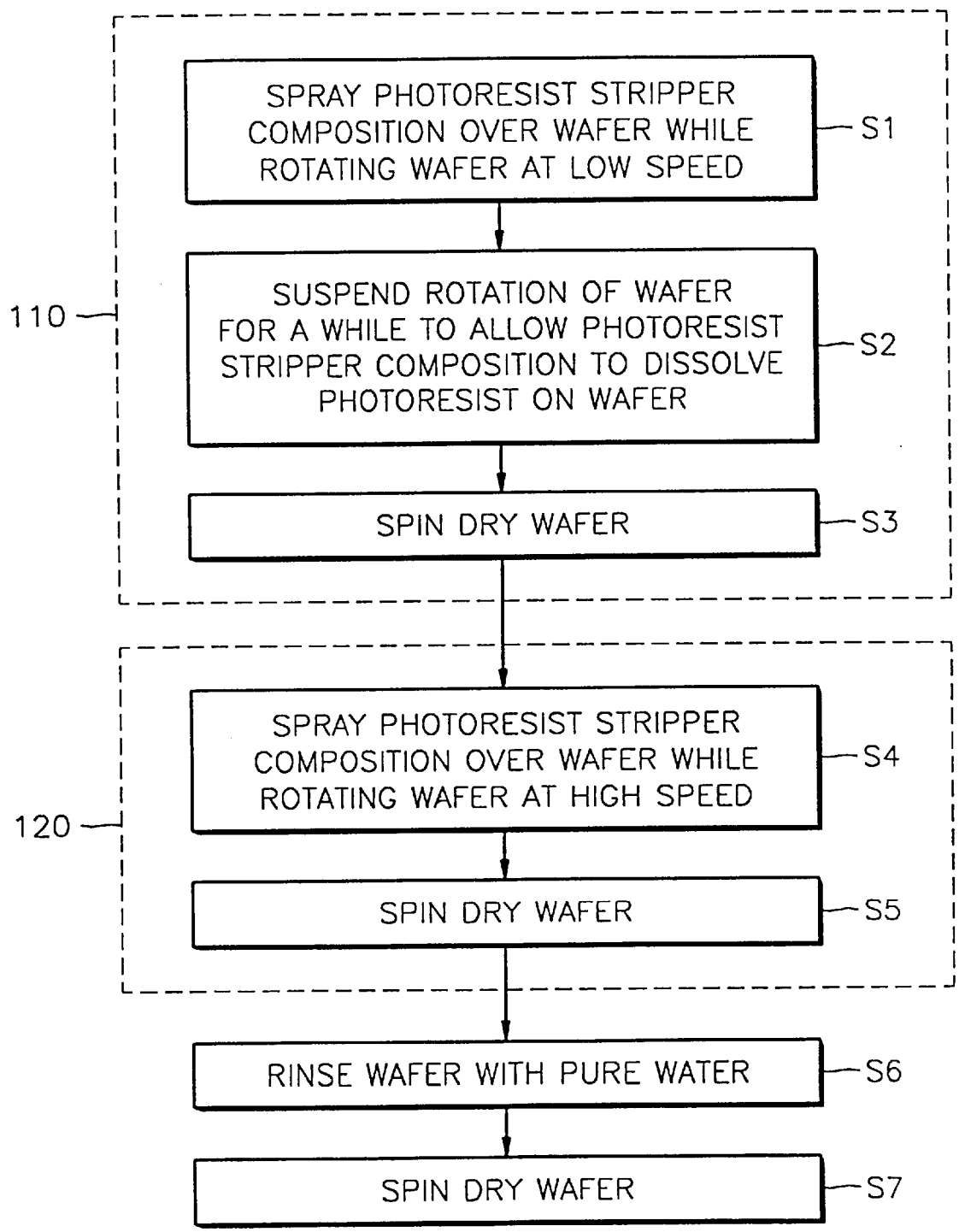
FIG. 2 is a flowchart illustrating a method for stripping photoresist according to a preferred embodiment of the present invention.

FIG. 2 is a flow diagram illustrating a preferred embodiment of a method for stripping photoresist from a wafer according to the present invention, using the stripper unit 100 shown in FIG. 1. The photoresist stripping method according to the present invention, which will now be described, is applicable to remove the photoresist mask pattern from a wafer which was used as an etching mask to pattern an underlying layer during a photolithography process. The photoresist stripping method can also be applied in a rework process for wafers, which were rejected after the photolithography process due to defects or which were set aside for process management testing.

The photoresist stripping method according to the present invention includes a low-speed rotation stripping step 110, a high-speed rotation stripping step 120 and a rinsing step 36. In particular, in step 110, a substrate, for example, the silicon wafer W, which is coated with photoresist, is put on the spin chuck 12 of the stripper unit 100 as shown in FIG. 1. Then, a photoresist stripper composition is spread over the wafer W through the nozzle 22 for about 10 to 20 seconds while rotating the wafer W at a relatively low speed of about 1200 to 1500 rpm (sub-step S1). Here, because the water is rotating on the spin chuck 12, the photoresist stripper composition is uniformly applied over the wafer W by centrifugal force.

The photoresist stripper composition according to the present invention, which was previously described, can be used for the photoresist stripping process. In the present embodiment, the photoresist stripper composition, a mixture of y-butyrolactone, acetone and n-butyl acetate, is applied at room temperature. As an example, the photoresist stripper composition used in the present embodiment includes 5% by weight y-butyrolactone, 10% by weight acetone and 85% by weight n-butyl acetate, based on the total weight of the mixture.

Then, the rotation of the spin chuck 12 is stopped for about 20 to 30 seconds (sub-step S2). In sub-step S2, the photoresist on the wafer W is dissolved by the photoresist stripper composition. Following this, the spin chuck 12 is rotated at a higher speed, so that the wafer W is spin dried (sub-step S3).

For removal of the photoresist residue from the wafer W, the high-speed rotation stripping step 120 is carried out. In particular, the photoresist stripper composition according to the present invention is spread uniformly over the wafer W through the nozzle 22 for about 10 to 20 seconds, while rotating the wafer W at a relatively high speed of, for example, about 2000 to 2500 rpm (sub-step S4). Following this, the spin chuck 12 is rotated at a higher speed, so that the wafer W is spin dried (sub-step S5).

After the high-speed rotation stripping step 120, the wafer W is subjected to a rinsing process with pure water to remove all organic substances from the wafer W (step S6).

Then, the spin chuck 12 is rotated at a higher speed to spin dry the wafer W. so that the pure water used in the rinsing step S6 is completely removed (step S7).

All of steps S1 through S7 described above can be performed at room temperature.

The photoresist stripping method according to the present invention involves two stages of stripping process, i.e., the low-speed rotation stripping step 110 and the high-speed rotation stripping step 120, and thus the photoresist can be completely removed from the wafer W. Also, the photoresist stripping composition according to the present invention is highly volatile, so that nearly none of it remains on the wafer W after the removal of the photoresist. The rinsing step S6 with pure water, which is performed after the striping process, is sufficient to remove the remaining organic substance from the surface of the wafer W, without need to perform a rinse with an organic solvent such as isopropyl alcohol (IPA). The rinsing step S6 is thus simplified in the photoresist stripping method according to the present invention.

The photoresist stripper composition according to the present invention is applicable for a wafer edge rinse using the edge rinsing nozzle 24 of the stripper unit 100 shown in FIG. 1. In this case, the photoresist stripper composition according to the present invention is spread on the edge of the wafer W through the edge rinsing nozzle 24. As a result, the remaining photoresist is uniformly removed from the edge of the wafer W in contact with the stripper composition distributed through the edge rinsing nozzle 24, so that the surface of the wafer W becomes smooth.

On the other hand, the photoresist stripper composition according to the present invention can be applied for a wafer backside rinse using the backside rinsing nozzle 26 of the stripper unit 100 shown in FIG. 1. As in the edge rinsing process, the photoresist residue can be uniformly removed from the backside of the wafer W, leaving a smooth surface free of organic solvents.

As described above, the photoresist stripper composition according to the present invention is effectively applicable at room temperature with respect to a variety of photoresists. The photoresist stripper composition has a high dissolution rate and is highly volatile, and thus the photoresist stripper composition scarcely remains on the wafer surface. The photoresist stripper composition according to the present invention can be effective in a photoresist mask removing process, a rework process, a wafer edge rinsing process, a wafer backside rinsing process and so forth.

The photoresist stripping method according to the present invention can completely remove any photoresist from a wafer through two stages of stripping process, i.e., a low-speed rotation stripping step and a high-speed rotation stripping step. In addition, the photoresist stripping method does not need to include a step for rinsing with an organic solvent. Rather, the use of pure wafer is sufficient to rinse organic substances from the wafer surface. Therefore, the overall process can be simplified as compared to a conventional stripping method which involves rinsing with an organic solvent.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A photoresist stripping method comprising:
    spraying a photoresist stripper composition comprising a mixture of acetone, γ-butyrolactone and an ester solvent, over a substrate while rotating the substrate at a first speed, so as to strip photoresist from the substrate;
    stopping the rotation of the substrate for a period of time;
    spraying the photoresist stripper composition over the substrate while rotating the substrate at a second speed which is higher than the first speed; and
    rinsing the, substrate with pure water.

2. The photoresist stripping method of claim 1, further comprising spin drying the substrate after said stopping the rotation of the substrate and before said spraying the photoresist stripper composition while rotating the substrate at the second speed.

3. The photoresist stripping method of claim 1, further comprising spin drying the substrate after said spraying the photoresist stripper composition while rotating the substrate at the second speed and before said rinsing the substrate with pure water.

4. The photoresist stripping method of claim 1, wherein the first speed is 1200 to 1500 rpm.

5. The photoresist stripping method of claim 1, wherein the second speed is 2000 to 2500 rpm.

6. The photoresist stripping method of claim 1, wherein said spraying the photoresist stripper composition while rotating the substrate at the first speed step is carried out for 10 to 20 seconds.

7. The photoresist stripping method of claim 1, wherein the period of time is 20 to 30 seconds.

8. The photoresist stripping method of claim 1, wherein said spraying the photoresist stripper composition while rotating the substrate at the second speed step is carried out for 10 to 20 seconds.

9. The photoresist stripping method of claim 1, wherein, based on a total weight of the mixture, the mixture comprises:

3 to 35% by weight acetone;
   2 to 13% by weight γ-butyrolactone; and
   55 to 95% by weight ester solvent.

10. The photoresist stripping method of claim 1, the photoresist stripper composition further comprising a surfactant.

11. The photoresist stripping method of claim 1, wherein the ester solvent contained in the photoresist stripper composition comprises at least one selected from the group consisting of n-butyl acetate, amyl acetate, ethyl acetoacetate, isopropyl acetate and propylene glycol monomethyl ether acetate.

12. The photoresist stripping method of claims 1, wherein based on a total weight of the mixture, the mixture comprises:

8 to 15% by weight acetone;
   4 to 7% by weight y-butyrolactone; and
   80 to 90% by weight n-butyl acetate.

* * * * *